Jan. 13, 1959 L. E. COUTERMASH ET AL 2,868,984

CAPACITIVE CONTACTOR TUNER FOR VERY HIGH RADIO AND TELEVISION FREQUENCIES

Filed Feb. 28, 1955

3 Sheets-Sheet 1

Inventors
Louis E. Coutermash
Francis G. Mason
By Ooms, McDougall, Williams & Hersh
Attorneys Jan. 13, 1959 L. E. COUTERMASH ET AL 2,868,984

CAPACITIVE CONTACTOR TUNER FOR VERY HIGH RADIO AND TELEVISION FREQUENCIES

Filed Feb. 28, 1955 3 Sheets-Sheet 2

Inventors
Louis E. Coutermash
Francis G. Mason
By Owen, McDougall, Williams & Hersh
Attorneys Inventors
Louis E. Coutermash
Francis G. Mason
By Ooms, McDougall, Williams & Hersh
attorneys 2,868,984

CAPACITIVE CONTACTOR TUNER FOR VERY HIGH RADIO AND TELEVISION FREQUENCIES

Louis E. Coutermash, Norwalk, and Francis G. Mason, Weston, Conn., assignors to Aladdin Industries, Incorporated, Nashville, Tenn., a corporation of Illinois Application February 28, 1955, Serial No. 490,854

6 Claims. (Cl. 250—40)

This invention relates to radio frequency tuners and particularly to a new and improved tuner which is particularly well adapted to cover the commercial very high frequency television bands extending from 54 to 216 megacycles.

One principal object of the invention is to provide a rotary tuning device capable of covering the V. H. F. television band, or some other wide frequency range, in a single rotation of a tuning control element.

A further object of the invention is to provide a new and improved high frequency tuning device which may be manufactured with an extremely high order of precision, yet at very low cost, so that all of the desired tuning channels will be accurately covered.

It is another object of the invention to provide a new and improved high frequency tuning device which is mechanically smooth and electrically noiseless in operation.

A further object is to provide a new and improved tuning element which is capable of being tracked accurately with any desired number of other tuning elements of similar type.

It is another object to provide an improved tuning element which is extremely small in size and is capable of being assembled with other similar tuning elements into a highly compact, mechanically efficient, low-cost tuning unit for a television receiver or the like.

Further objects and advantages of the invention will appear from the following description, taken with the accompanying drawings, in which:

Figure 1 is a plan view of an illustrative embodiment of the invention in the form of a complete superheterodyne tuning unit for a television receiver or the like;

Fig. 2 is a left side elevational view of the tuning unit;

Fig. 3 is a front view of the tuning unit;

Figures 1, 2, 3:
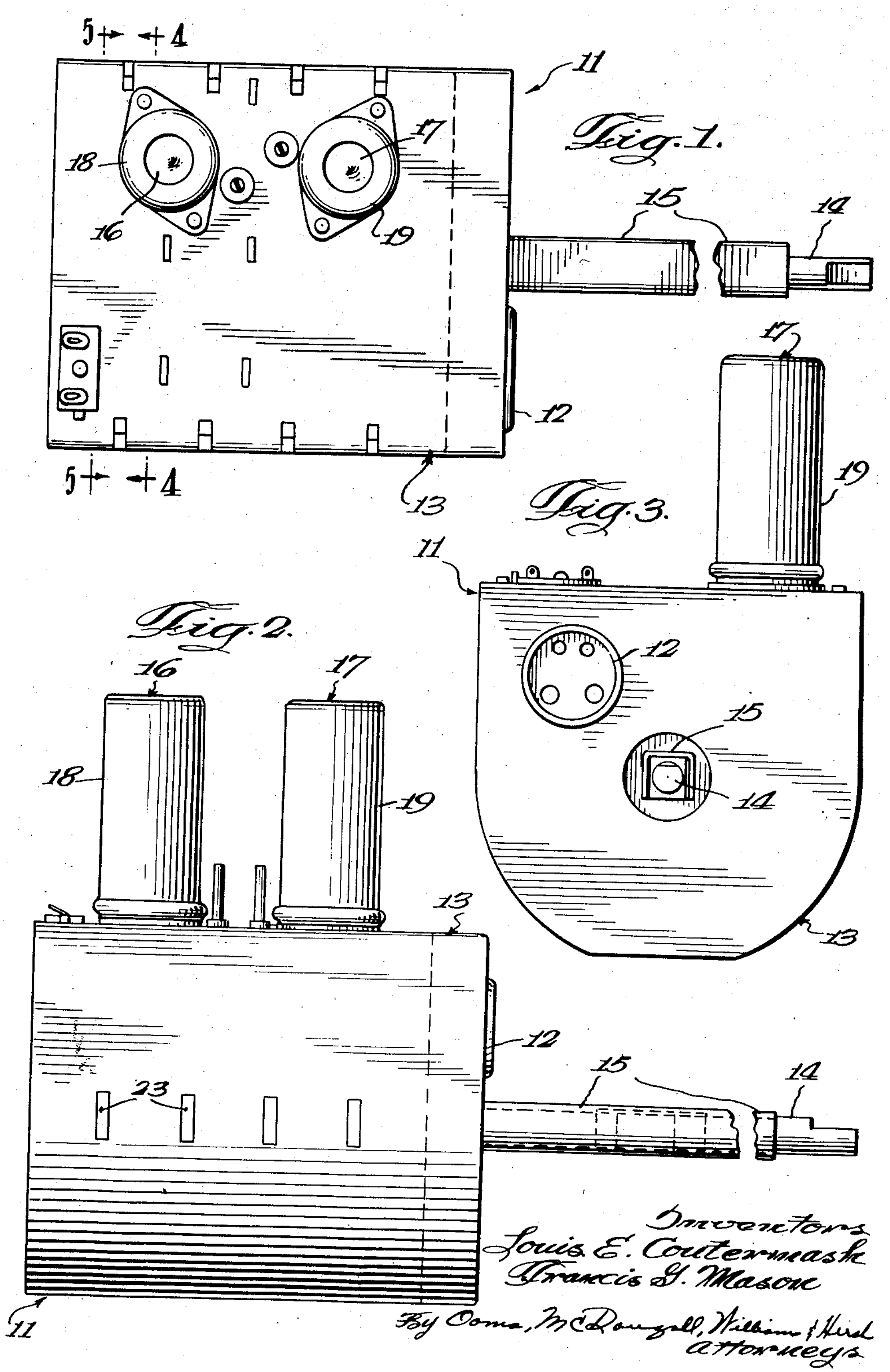
Figures 4, 6, 8:
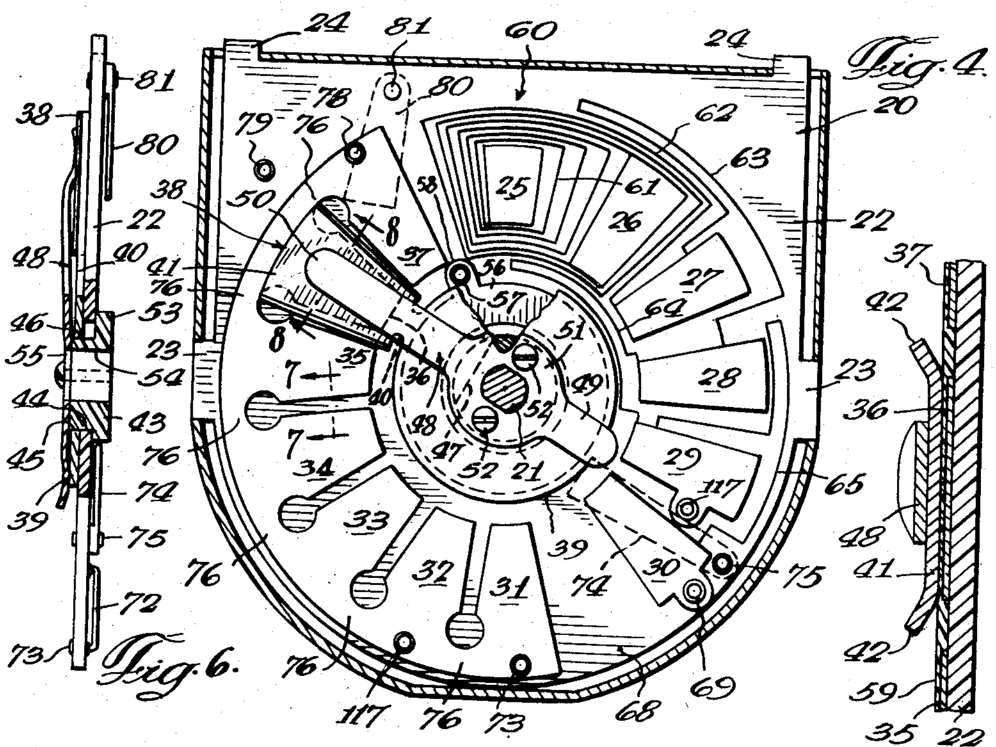
Fig. 4 is an enlarged elevational sectional view, taken generally along a line 4—4 in Fig. 1, to show one of the several tuning elements embodied in the tuning unit.
Fig. 6 is a right side view of the tuning element of Fig. 4.
Fig. 8 is a greatly enlarged fragmentary cross-sectional view taken generally along a line 8—8 in Fig. 4.
Figure 7:
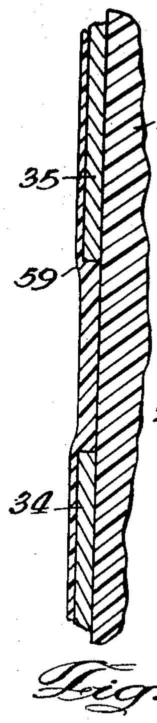
Fig. 7 is a greatly enlarged fragmentary cross-sectional view taken generally along a line 7—7 in Fig. 4.
Figure 5:
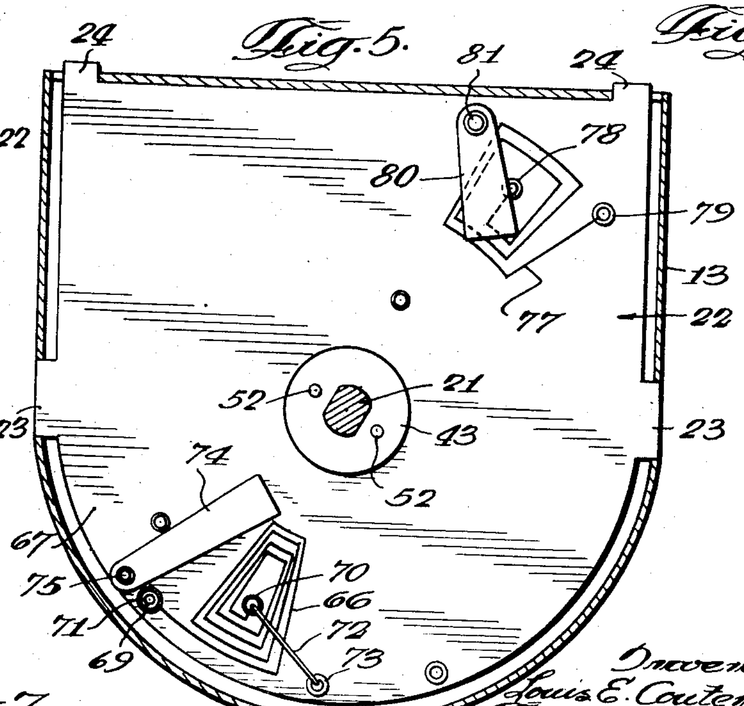
Fig. 5 is an elevational sectional view, taken generally along a line 5—5 in Fig. 1, to show the rear of the tuning element of Fig. 4.

If the drawings are considered in greater detail, it will be seen that Figs. 1–3 illustrate a complete superheterodyne tuning unit 11 adapted to be used as the input portion of a conventional television or radio receiver. The illustrated tuning unit 11 is adapted to cover the commercial V. H. F. television channels between 54 and 216 megacycles. In addition, the tuning unit 11 is provided with a socket 12 for receiving a plug connected to an ultrahigh frequency converter unit (not shown).

Thus, it is a simple matter to utilize a separate U. H. F. converter so that the U. H. F. channels from 470 to 890 megacycles may also be covered.

It will be seen that the tuning unit 11 is built on a metal housing or chassis 13 which is of extremely small size. Extending forwardly from the housing 13 are two coaxial tuning shafts 14 and 15, which serve respectively as a channel selector shaft and a fine tuning shaft. Two tubes 16 and 17 are mounted on the top of the chassis 13. The tube 16 may be a twin triode and may serve as a radio frequency amplifier. The other tube 17 may constitute a combination of a triode oscillator section and a multigrid converter section. Suitable shields 18 and 19 are mounted around the tubes.

The illustrated superheterodyne tuning unit 11 embodies four tuning elements 20 of the general type shown in Figs. 4–8. A common operating shaft 21, preferably made of an insulating material, extends through all of the tuning elements 20 and is connected to the channel selector shaft 14.

All of the tuning units 20 are basically the same in construction. Accordingly, a detailed description of the single specific tuning element shown in Figs. 4–8 will suffice. The illustrated tuning element 20 is supported on a thin flat plate 22 made of en electrically insulating material, which may be of plastic or glass, for example. It will be seen that the illustrated plate 22 is shaped to fit snugly as a transverse partition in the chassis 13 and is formed with lugs 23 and 24 extending through the chassis wall to secure the plate in place.

To cover the twelve V. H. F. television channels and to provide for the attachment of a separate U. H. F. converter, thirteen segments or electrodes 25—37 are mounted on the front surface of the plate 22. It will be seen from Figs. 4 and 8 that the electrodes 25—37 are in the form of extremely thin plate-like members which are angularly spaced in a circular pattern on the supporting plate 22. Each of the electrodes 25—37 is in the shape of a segment of a ring.

Preferably, the segmental electrodes 25—27 are directly adherent to the insulating plate 22 and are formed on the plate by conventional or suitable printing techniques. Various circuit printing techniques are known whereby metal may be applied to an insulating surface in any desired pattern. Accordingly, it will not be necessary to enter into any detailed description of the printing techniques whereby the electrodes 25—37 may be applied to the supporting plate 22. In this connection, however, reference should be had to the copending application of Harold T. Lyman, Serial No. 450,750, filed August 18, 1954, "Method of and Apparatus for Producing Coils Photographically," and to the copending application of Harold J. Yanosik, Serial No. 467,350, filed November 8, 1954, "Method of and Apparatus for Producing Coils or the Like Photographically," which describe suitable photographic circuit printing techniques. For the present purpose, it is sufficient that the metal plate-like electrodes 25—37 be a few thousandths of an inch thick.

The tuning shaft 21 is adapted to operate a rotatable tuning element or selector 38 which is swingable into energy exchange relation with each of the electrodes 25—37 in turn. It will be seen that the illustrated vane-like selector 38 is in the form of a central disc-like metal portion 39 having a radial arm 40 terminating in a segmental plate-like slider 41. Opposite edges 42 of the slider 41 may be turned up to facilitate movement of the slider over the electrodes 25—37.

The tuning selector 38 is adapted to be connected to the shaft 21 by means of a rotatable hub 43, preferably made of insulating material. It will be seen that the hub 43 is rotatably received in an aperture 44 formed in the insulating plate 22. An aperture 45 is formed in the central disc-like portion 39 of the tuning selector 38 to receive the front end of the hub 43. In order to hold the tuning selector 38 nonrotatable on the hub 43, a flat 46 is provided on one side of the hub for engagement with a complementary flat 47 formed on one side of the aperture 45.

The tuning selector 38 is biased against the front of the supporting plate 22 by means of a leaf spring 48 having radial arms 49 and 50 engaging the central disclike portion 39 and the segmental slider portion 41 of the selector. A central apertured portion 51 of the spring 48 is secured to the front of the hub 43 by means of a pair of screws 52 or the like. A shoulder or flange 53 is provided at the rear end of the hub 43 to react against the rear side of the plate 22 so that the leaf spring 48 can bias the tuning selector 38 rearwardly against the front surface of the plate 22. The tuning shaft 21 is adapted to be received in alined, noncircular apertures 54 and 55 formed in the hub 43 and the spring 48.

Provision is made for establishing an electrically noiseless circuit connection to the rotatable tuning selector 38. To this end, an energy exchange ring electrode 56 is mounted on the insulating plate 22 around the central aperture 44. Like the electrodes 25—37, the thin disc-like ring 56 preferably is directly adherent to the plate 22 and is applied by circuit printing techniques. A soldered connection may be made to an eyelet 57 extending through a tab 58 which projects radially from the ring 56. It will be seen that the coupling ring 56 directly underlies the disc-shaped central portion 39 of the tuner selector 38.

In order that the mode of coupling between the tuning selector and the coupling ring 56 may be purely capacitative, a dielectric element 59 (Figs. 7 and 8) preferably is interposed between the tuning selector 38 and the coupling ring 56. The dielectric element 59 also extends over the segmental electrodes 25—37 so that the mode of coupling between these electrodes and the tuning selector 38 also is purely capacitative. Accordingly, the dielectric element 59 virtually eliminates all electrical noise in connection with the movement of the tuning selector 38. Preferably, the dielectric element 59 takes the form of a hard dielectric coating over the front surfaces of the electrodes 25—37, the ring 56, and the adjacent portions of the insulating plate 22. The coating may be made of any suitable hard low-loss lacquer or lacquer-like material. A coating which is a few thousandths of an inch in thickness will suffice.

The illustrated tuning device 20 is provided with a tuning inductance 60 which connects the electrodes 25—37 in series. Preferably, the entire tuning inductance is of thin ribbon-like form and is directly adherent to the insulating plate 22. Like the electrodes 25—37 and the ring 46, the tuning inductance 60 preferably is applied to the plate 22 by circuit printing techniques. In this way, the tuning inductance 60 can be formed in any desired pattern with an extremely high order of precision. At the same time, the cost of forming the tuning inductance 60 is very low.

The details of the flat tuning inductance 60 are of some interest in connection with the present invention. It will be recalled that the first segmental electrode 25 is provided in order to facilitate the connection of an ultrahigh frequency converter. To this same end, the tuning inductance 60 extends between the first electrode 25 and the second electrode 26 in a flat ribbon-like coil 61 which spirals around the first electrode 25. It will be seen that the flat coil element 61 comprises approximately three and one-half turns.

The second through the thirteenth electrodes 26—37 are provided to cover channels 2–13 of the V. H. F. television band. In order to resonate channel 2, the tuning inductance 60 extends between the channel electrodes 26 and 27 in a flat spiral coil 62 which encircles the first and second electrodes 25 and 26. It will be seen that the spiral coil 62 comprises approximately two turns.

Between the electrodes 27, 28, 29, and 30 for channels 3, 4, 5, and 6, the inductance coil 60 extends in three arcuate hairpin-like loops 63, 64, and 65. In order to utilize the available space most efficiently, the loops 63 and 65 are disposed beyond the outer edges of the electrodes 26—30, while the intermediate loop 64 is located between the outer edge of the ring 56 and the inner edges of the electrodes 25—29.

In order to resonate channel 6 of the V. H. F. television band, it is preferred to form the inductance coil 60 as a flat spiral coil 66 between the electrodes 30 and 31. It will be seen that the illustrated spiral coil 66 is adherent to the rear surface 67 of the insulating plate 22, while the electrodes 25—37 are adherent to the front surface 68. As shown, the spiral coil 66 comprises approximately four turns extending between terminal spots 69 and 70. An eyelet 71 is employed to connect the terminal spot 69 to the electrode 30. In this instance, a wire lead 72 is soldered directly to the terminal spot 70. The opposite end of the lead 72 is soldered to an eyelet 73 which extends through the electrode 31.

In order to provide for a tracking adjustment at channel 6 of the television band, a movable tracking member 74 is pivotally mounted on the insulating plate 22 adjacent the coil 66. In this instance, a rivet 75 affords pivotal support for the member 74, which is in the form of a vane adapted to be swung over the coil 66 so as to vary the inductance of the coil. It is preferred that the vane 74 be composed of a magnetic material having low loss at the frequency involved, although in some cases the vane 74 may be simply made of metal. Suitable molded ferrite or powdered iron materials are known for the tracking vane 74.

To resonate channels 7–12, the tuning inductance 60 preferably extends as a plurality of simple arcuate ribbon-like elements 76 between the electrodes 31–37. Because of the high frequencies involved, these short arcuate conductive elements furnish sufficient inductance, in combination with the adjacent portions of the electrodes 31–37, to differentiate between the successive channels.

At the high frequency end of the television band, channel 13 preferably is resonated by means of a flat, ribbon-like spiral coil 77 (Fig. 5) adherent to the rear surface 67 of the insulating plate 22. An eyelet 78 connects one end of the spiral coil 77 to the electrode 37. At the other end of the coil 77, an eyelet 79 provides an end terminal to which a lead may be soldered.

A tracking adjustment at the high frequency end of the band is effected by means of a movable vane 80 which is pivotally mounted on the plate 22 by means of a rivet 81. It is preferred to form the vane 80 of metal, although it may be made of ferrite, powdered iron, or other low-loss magnetic material. Moving the vane 80 over the coil 77 will vary the inductance of the coil and thereby effect a tracking adjustment.

Figure 9:
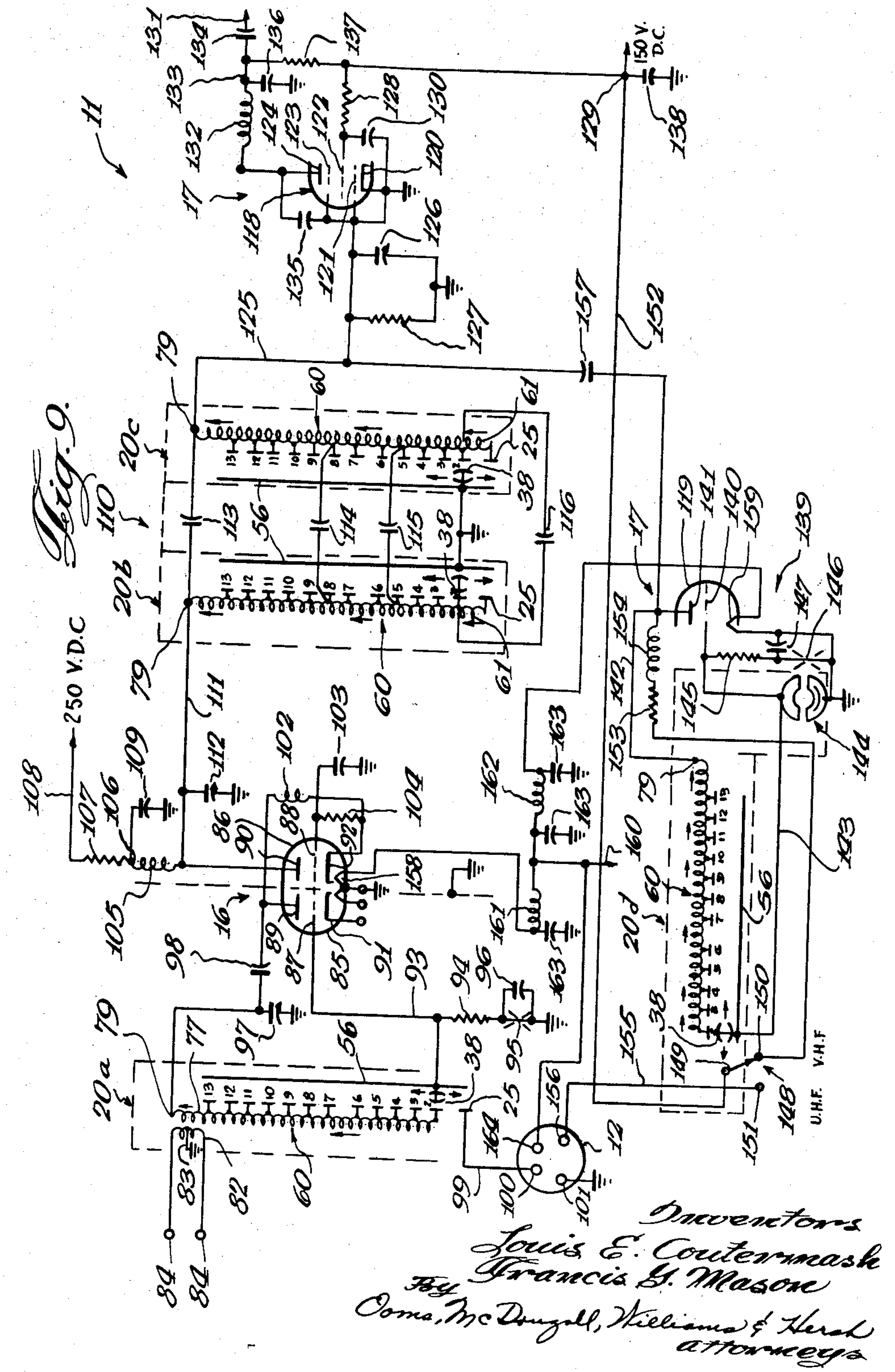
Fig. 9 is a schematic circuit diagram of the complete tuning unit shown in Figs. 1–3.

The schematic circuit diagram of Fig. 9 illustrates one manner in which several tuning devices 20, of the type shown in Figs. 4–8, may be interconnected so as to form the complete tuning unit 11. For the purpose of the circuit diagram, the four tuning devices 20 of Fig. 9 will be designated 20*a*, 20*b*, 20*c*, and 20*d*.

In this instance, the first tuning device 20*a* is employed to couple an antenna to the radio frequency amplifier tube 16. It will be seen that the tuning element 20*a* is provided with an antenna primary coil 82 having a grounded center tap 83. The ends of the antenna coil 82 extend to a pair of antenna terminals 84 which may be connected to a balanced antenna transmission line (not shown). The antenna coil 82 is disposed adjacent the coil element 77 at the channel 13 end of the tuning coil 60. It is preferred to form the antenna coil 82 as an additional flat ribbon-like element directly adherent to the insulating plate 22 of the tuning element 20*a*, but in some cases the antenna coil 82 may be formed as a separate wire winding positioned adjacent the flat spiral coil element 77.

Any standard or suitable circuit arrangement may be employed in connecting the antenna tuning element 20*a* to the radio frequency amplifier tube 16. In this instance, the tube 16 comprises a pair of triodes 85 and 86 having respective grids 87 and 88, plates 89 and 90, and cathodes 91 and 92. It will be seen that the tuning selector 38 is connected to the grid 87 of the first triode 85, this connection being made by extending a lead 93 between the grid and the coupling ring 56 on the tuning element 20*a*. A grid return resistor 94 and a metering jumper 95 are connected in series between the grid 87 and ground, a bypass capacitor 96 being connected across the metering jumper 95.

At the channel 13 end of the tuning coil 60, the terminal eyelet 79 is bypassed to ground by an adjustable neutralizing capacitor 97. A coupling capacitor 98, acting in combination with the neutralizing capacitor 97, is connected between the terminal 79 and the plate 89 of the triode 85.

To provide for the connection of an ultrahigh frequency converter, the converter electrode 25 of the antenna tuning element 20*a* is connected to a lead 99 which extends to one terminal 100 of the U. H. F. socket 12. This terminal 100, in conjunction with a grounded terminal 101, provides an input circuit for an intermediate frequency signal received from a separate U. H. F. converter. When the tuning selector 38 overlies the U. H. F. electrode 25, the intermediate frequency signal from the lead 99 is applied to the grid 87 of the radio frequency amplifier triode 85. It will be seen that the antenna tuning element 20*a* differs from the specific tuning element 20 shown in Figs. 4–8 in that the intermediate frequency coil element 61 is omitted from the antenna tuning element 20*a*. Thus, the U. H. F. electrode 25 serves simply as a coupling electrode between the input terminal 100 and the tuning selector 38. It will be understood that the signal from the separate U. H. F. converter is ordinarily at a fixed intermediate frequency, such as 43.5 megacycles, for example, and that the tuning unit 11 serves simply as an additional intermediate frequency amplifier when the U. H. F. converter is being employed.

When the tuning selector 38 of the antenna tuner is at any one of the electrodes 26–37, corresponding to channels 2–13, the portion of the tuning coil 60 between the tuning selector and the end terminal 79 is resonated by the capacitor 97, the interelectrode capacitances of the triode 85, and the various distributed capacitances existing between the circuit leads, the various elements of the coil 60 and ground. The tuning is varied by changing the effective inductance of the antenna tuner 20*a*, while the various resonating capacitances remain substantially constant.

In the known manner, the plate 89 of the first radio frequency triode section 85 is connected to the cathode 92 of the second triode section 86 through a small radio frequency choke 102. The grid 88 of the second triode section 86 is effectively connected to ground through a bypass capacitor 103. A grid return resistor 104 is connected between the grid 88 and the cathode 92.

Positive plate potential is applied to the plate 90 of the second triode section 86 through a radio frequency choke 105 connected between the plate and the terminal 106. A filtering resistor 107 extends from the terminal 106 to a plate supply lead 108 representing a source of positive plate supply voltage. A bypass capacitor 109 is connected between the terminal 106 and ground.

In this instance, the second and third tuner elements 20*b* and 20*c* are connected in a band pass filter circuit 110 between the plate 90 of the radio frequency amplifier 16 and the input of the converter or mixer tube 17. Thus, signals are carried from the plate 90 to the tuner section 20*b* over a lead 111 connected between the plate and the end terminal 79 of the tuner 20*b*. A small adjustable trimmer capacitor 112 may be connected between the lead 111 and ground. The tuning selectors 38 of both of the tuners 20*b* and 20*c* are grounded in this instance. It will be understood that the ground connections are actually made to the coupling rings 56 of the tuners 20*b* and 20*c*.

Coupling is afforded between the tuners 20*b* and 20*c* by means of a plurality of small coupling capacitors 113, 114, 115, and 116. It will be seen that the capacitor 113 is connected between the end terminals 79 of the respective tuners 20*b* and 20*c*, while the capacitors 114, 115, and 116 are connected between the channel 8, channel 5, and channel 2 electrodes of the tuners 20*b* and 20*c*. For convenience, the electrodes designated 26—37 in Figs. 4–8 are marked with channel numbers in the circuit diagram of Fig. 9. Eyelets may be mounted in the various electrodes so that soldered connections to the capacitors 113—116 may readily be made. Such eyelets are shown at 117 in Fig. 4.

It will be seen that the electron discharge tube 17 comprises a multigrid converter or mixer section 118 and a triode oscillator section 119, both having a common cathode 120. In addition, the mixer section 118 is provided with a control grid 121, a screen grid 122, a suppressor 123, and a plate 124. A lead 125 is connected between the terminal 79 of the tuner section 20*c* and the control grid 121 to carry signals from the band pass filter 110 to the mixer section 118. It will be seen that an adjustable trimmer capacitor 126 and a grid return resistor 127 are connected in parallel between the control grid 121 and ground. The screen grid 122 is supplied with positive potential through a voltage dropping resistor 128 connected to a positive plate supply terminal 129. A bypass capacitor 130 is connected between the screen grid 122 and ground. The suppressor grid 123 is directly grounded in the usual manner.

Intermediate frequency signals are carried from the plate 124 to an output lead 131 through a radio frequency filtering choke 132, a lead 133, and a blocking capacitor 134 connected in series. Radio frequency bypass capacitors 135 and 136 are connected between the opposite ends of the choke 132 and ground. A plate load resistor 137 extends between the lead 133 and the plate supply terminal 129. The terminal 129 is bypassed to ground by a capacitor 138.

With the movable tuning selectors 38 of the band pass filter sections 20*b* and 20*c* opposite the intermediate frequency electrodes 25, the band pass filter 110 is tuned to the intermediate frequency, which is usually 43.5 megacycles. Accordingly, an intermediate frequency signal from an ultrahigh frequency converter, connected to the socket 12, will be amplified by the tubes 16 and 118 and will be resonated by the band pass filter 110. For this condition of operation, the entire tuning coil 60 of each filter section 20*b* and 20*c* is in the resonant circuit between the terminal 79 and ground. It will be understood that the tuning coils 60 are resonated by the trimmer capacitors 112 and 126, the output and input capacitances of the tubes 16 and 17, the capacitances to ground afforded by the tuning selectors 38, and the various distributed circuit capacitances.

As the tuning selectors 38 of the band pass filter sections 20*b* and 20*c* are moved over the various electrodes for channels 2–13, the effective inductances of the tuning coils 60 are diminished because only the portions of the coils between the terminals 79 and the selectors 38 are effectively in the resonant circuit. The provision of the several coupling capacitors 113—116 provides the requisite degree of coupling at all of the various tuning positions of the tuning selectors 38.

The fourth tuner section 20*d* is employed in a superheterodyne oscillator circuit 139, which utilizes the triode section 119 of the tube 17. It will be seen that this triode section comprises a grid 140 and a plate 141, in addition to the cathode 120. The end terminal 79 of the tuner section 20*d* is connected through a lead 142 to the plate 141. A lead 143 establishes a connection between the grid 140 and the rotatable tuning selector 38 of the tuner 20*d*. It will be noted that the tuner section 20*d* differs specifically from the tuner 20 shown in Figs. 4–8 in that the ultrahigh frequency converter electrode 25 and the coil section 61 are omitted entirely from the tuner 20*d*.

To provide for fine tuning of the oscillator 139, a small variable capacitor 144 is connected between the grid 140 and ground. The capacitor 144 is operable by the fine tuning shaft 15 (Fig. 1).

In the usual manner, a grid return resistor 145 and a metering jumper 146 are connected in series between the grid 140 and ground. A bypass capacitor 147 is connected across the metering jumper 146.

Plate supply voltage is adapted to be supplied to the oscillator 139 through a two-position switch 148 having a movable contact 149 and a pair of fixed contacts 150 and 151. The switch 148 affords a selection between V. H. F. and U. H. F. operation. Thus, the movable contact 149 is connected through a lead 152 to the plate supply terminal 129. A load resistor 153 and a radio frequency choke 154 are connected in series between the fixed contact 150 and the plate 141 of the oscillator triode. The other fixed switch contact 151 is connected through a lead 155 to one terminal 156 of the U. H. F. socket 12. It will be understood that the terminal 156 serves to transmit plate supply voltage to a separate U. H. F. converter connected to the socket 12. With the movable switch contact 149 engaging the contact 150, the oscillator 139 is energized so that the tuning unit 11 will operate as a superheterodyne converter section for V. H. F. television signals. With the switch contact 149 engaging the contact 151, the oscillator 139 is de-energized and the separate U. H. F. converter is energized. The intermediate frequency output of the U. H. F. converter is amplified by the radio frequency amplifier tube 16 and the mixer section 118 of the tube 17.

For normal V. H. F. converter operation, the output of the oscillator 139 is injected into the mixer section 118 by means of a small coupling capacitor 157 connected between the plate 141 of the oscillator triode 17 and the grid 121 of the mixer section 118.

It will be understood that the tubes 16 and 17 are provided with heaters 158 and 159 energized from a heater supply lead 160 through radio frequency filtering chokes 161 and 162. Radio frequency bypass capacitors 163 are employed in the usual manner in the heater circuit. The heater supply lead 160 is connected to another terminal 164 of the U. H. F. converter socket 12 in order that the separate U. H. F. converter may be supplied with heater voltage.

While the operation of the superheterodyne tuning unit 11 and of the four tuners 20 embodied therein will be clear from the foregoing description, it may be helpful to offer a brief summary. The tuning unit 11 is placed in operation by connecting the output terminals 84 to a suitable antenna. The output lead 131 is connected to the input of a suitable intermediate frequency amplifying system. Suitable plate supply voltages are applied between ground and the plate supply terminals 108 and 129. A source of heater voltage is connected between ground and the heater supply lead 160. For normal operation of the tuning unit, the switch 149 is set in its V. H. F. position, as shown in Fig. 9, so that plate voltage will be applied to the oscillator tride 17.

Any of the very high frequency television channels may be selected by turning the main control shaft 14 of the tuning unit 11 to the proper predetermined position. All of the tuning selectors 38 of the four tuner sections 20*a*–20*d* are rotated in common by the shaft 14. As each of the tuning vanes or selectors 38 is rotated, it moves over each of the segmental plate-like electrodes 25–37 in turn. The flat plate-like slider arm 41 of the tuning selector 38 is thus movable into an energy exchange relation with each of the electrodes 25–37. By virtue of the dielectric coating 59 over the electrodes 25–37, the mode of energy exchange between the tuning selector 38 and the electrodes is purely capacitive. In other words, the tuning selector 38 is movable into capacitive coupling relation with the successive stationary electrodes in turn.

Circuit connections are made to the tuning selector 38 of each of the tuner sections 20 by means of the stationary disc-like ring 56 which is capacitively coupled to the central disc-like portion 39 of the tuning selector. Movement of the tuning selector 38 to one of the segmental electrodes 26–37 for television channels 2–13 thus effectively couples the ring 56 to a selected point on the tuning inductance 60, which connects the electrodes in series. In the circuit arrangement of Fig. 9, the portion of each tuning inductance 60 between the end terminal 79 and the tuning selector 38 is effectively in the circuit, while the remaining portion is inactive. The active portion of the tuning inductance 60 is resonated by the various shunt and series capacitances in the particular circuit.

For any of the television channels 2–13, a signal is coupled from the antenna terminals 84 to the antenna tuner section 20*a* by the antenna primary coil 82. The portion of the tuning inductance 60 between the end terminal 79 and the tuning selector 38 forms a resonant circuit with the various circuit capacitances and the input capacitance of the tube 16. The lead 93 conveys the radio frequency signal from the tuning selector 38 to the input grid 87 of the triode section 85. Amplification of the signal occurs in the triode sections 85 and 86.

The band pass filter 110 conveys the radio frequency signal from the plate 90 of the amplifier triode 86 to the grid 121 of the mixer tube section 118. The grounded tuning selector 38 of each band pass filter section 20*b* and 20*c* effectively couples the selected channel electrode to ground so that the portion of the tuning inductance 60 between the end terminal 79 and the selected electrode will be resonated by the various capacitances in the circuit. Initial adjustment of each of the tuner sections 20*b* and 20*c* may be effected by varying the trimmer capacitors 112 and 126. Energy is transferred between the two band pas filter sections 20*b* and 20*c* by the coupling capacitors 113—116.

The oscillator 139 is tuned to the desired superheterodyning frequency by the portion of the turner section 20*d* between the tuning selector 38 and the end terminal 79, acting as a resonant circuit in combination with the various interelectrode and circuit capacitances. The coupling capacitor 157 carries the oscillator signal to the grid 121 of the mixer tube section 118. Thus, a signal at the fixed intermediate frequency appears at the plate 124 of the mixer tube section 118.

Tracking adjustments between the various tuner sections 20*a*–20*d* may be effected by moving the tracking vanes 74 and 80 so as to change the inductance of the coil elements 66 and 77. The vane 80 will effect a tracking adjustment at the high frequency end of the band, while the vane 74 is effective at an intermediate point in the band. Further refinements in tracking adjustment may be made by varying the trimmer capacitors 112 and 126.

It will be understood that the tuning devices 20*a*–20*d* may be manufactured with printed tuning inductances 60 which differ in form so as to obtain virtually perfect tracking at all channels in the television band. Once the desired conformation of the coils 60 has been established, they can be reproduced with great precision by circuit printing techniques. Thus, the matter of tracking adjustments is reduced to a minor problem from the point of view of the manufacturer.

A separate ultrahigh frequency converter may be connected to the very high frequency tuning unit 11 by means of the socket 12. The output of the U. H. F. converter is received between the socket terminal 100 and the grounded terminal 101, while plate and heater voltages are supplied to the converter by the terminals 156 and 164. For U. H. F. operation, the switch 148 is shifted so that the movable contact 149 engages the fixed contact 148. Plate potential is thereby disconnected from the oscillator 139 and supplied to the socket terminal 156. The main tuning shaft 14 is rotated to bring the tuning selectors of the sections 20a–20c opposite the U. H. F. coupling electrodes 25. Under these conditions the oscillator 139 is inoperable and the tubes 16 and 17 function as additional intermediate frequency amplifiers. The intermediate frequency signal from the U. H. F. converter is carried by the lead 99 to the U. H. F. coupling electrode 25 of the turner 20a, and then is simply transferred capacitively to the tuning selector 38. The inductance 60 of the tuner section 20a is effectively out of the circuit.

In the case of each of the band pass turner sections 20b and 20c, the entire inductance coil 60, including the coil element 61, is in the resonant circuit. The inductance of the coil element 61 is sufficient to lower the resonant frequency of the band pass tuner section to the desired intermediate frequency. Thus, the intermediate frequency signal is coupled to the mixer tube section 118 and is developed in amplified form at the output lead 141.

Since all of the inductance elements of each tuner section is printed on a single flat plate, the tuner sections are extremely compact and low in cost. At the same time, they may be manufactured with a high order of precision. By virtue of the purely capacitive coupling between the movable tuning selectors and the electrodes of the flat tuner sections, the operation of the tuning selectors is free from electrical noise.

Various modifications, alternative constructions and equivalents may be employed without departing from the true spirit and scope of the invention as exemplified in the foregoing description and defined in the following claims.

We claim:

1. A tuner for very high frequency television signals, said tuner comprising an electrically insulating plate having an aperture therethrough, a thin disc-like conductive coupling ring adherent to said plate around said aperture, a plurality of thin conductive angularly spaced segmental electrodes adherent to one side of said plate around said ring, a plurality of thin conductive ribbons adherent to said plate and extending between adjacent ones of said electrodes, said ribbons and said electrodes together defining a tuning coil interconnecting said electrodes in series, said electrodes being arranged sequentially as first, second, third, and so forth, in said series, the first of said ribbons extending between the first and second of said electrodes in a spiral around said first electrode, the second of said ribbons extending between said second and third of said electrodes in a spiral around the first and second of said electrodes, another of said ribbons extending between another pair of said electrodes in an arcuate hairpin-like loop spaced radially outwardly from said electrodes, another of said ribbons extending between another pair of said electrodes in an arcuate hairpin-like loop spaced radially inwardly from said electrodes, another of said ribbons extending in a spiral coil on the opposite side of said plate from said electrodes, connector elements extending through said plate between the opposite ends of said spiral coil and another pair of said electrodes, an adjustable magnetic vane pivotally mounted on said plate adjacent said spiral coil for varying the inductance thereof, an additional spirally coiled ribbon on said opposite side of said plate and having one end connected to the first of said electrodes, a conductive vane pivotally mounted on said plate adjacent said additional spirally coiled ribbon for adjusting the inductance thereof, a tuning element rotatably mounted in said aperture and capacitively coupled to said ring, and a slider on said tuning element slidable successively over said electrodes into capacitive coupling relation with each of said electrodes in turn.

2. A tuner for the twelve very high frequency television channels, said tuner comprising a flat insulating plate having an aperture therethrough, a thin metal disc-like ring adherent to said plate around said aperture, a thin insulating coating over said ring, a tuning element rotatable in said aperture and having a metal disc-like element overlaying said ring and capacitively coupled thereto, a metal radial arm connected to said disc-like element, a metal slider on the outer end of said arm and movable therewith along one surface of said plate along a circular path, thirteen thin metal plate-like angularly spaced segmental electrodes adherent to said plate along said circular path, a thin insulating coating over said electrodes, said slider being movable into capacitive coupling relation with each of said electrodes in turn, said electrodes from the first to the last constituting an intermediate frequency resonating electrode for use with an ultrahigh frequency converter and channel electrodes for television channels two through thirteen, an inductance coil connecting said electrodes from the first to the last in series and comprising a plurality of ribbons adherent to said plate and extending between the successive electrodes, the first of said ribbons extending between the intermediate frequency electrode and the channel two electrode and spiraling around said intermediate frequency electrode, the second of said ribbons extending between the channel two and channel three electrodes and spiraling around the intermediate frequency and the channel two electrodes, the third, fourth, and fifth ribbons constituting arcuate hairpin-like loops interconnecting the channel three, four, five, and six electrodes and alternately spaced radially outwardly and inwardly on said plate from said electrodes, the sixth ribbon being a spiral coil element adherent to the opposite side of said plate from said electrodes and being connected between the channel six and seven electrodes, a tracking vane pivotally mounted on said plate adjacent said sixth ribbon for varying the inductance thereof, the seventh through the ninth ribbons being arcuate elements interconnecting the channel seven through thirteen electrodes, an additional spiral ribbon coil adherent to the opposite side of said plate and having one end connected to the channel two electrode, and a tracking vane pivotally mounted on said plate adjacent said additional spiral ribbon coil for adjusting the inductance thereof.

3. A tuner for the twelve very high frequency television channels, said tuner comprising a flat insulating plate having an aperture therethrough, a thin metal disc-like ring adherent to said plate around said aperture, a thin insulating coating over said ring, a tuning element rotatable in said aperture and having a metal disc-like element overlying said ring and capacitively coupled thereto, a metal radial arm connected to said disc-like element, a metal slider on the outer end of said arm and movable therewith along one surface of said plate along a circular path, thirteen thin metal plate-like angularly spaced segmental electrodes adherent to said plate along said circular path, a thin insulating coating over said electrodes, said slider being movable into capacitive coupling relation with each of said electrodes in turn, said electrodes from the first to the last constituting an intermediate frequency resonating electrode for use with an ultrahigh frequency converter and channel electrodes for television channels two through thirteen, an inductance coil connecting said electrodes from the first to the last in series and comprising a plurality of ribbons adherent to said plate and extending between the successive electrodes, the sixth ribbon being a spiral coil element connected between the channel six and seven electrodes, a tracking vane pivotally mounted on said plate adjacent said sixth ribbon for varying the inductance thereof, an additional spiral ribbon coil adherent to said plate and having one end connected to the channel two electrode, and a tracking vane pivotally mounted on said plate adjacent said additional spiral ribbon coil for adjusting the inductance thereof.

4. A tuner for the twelve very high frequency television channels, said tuner comprising a flat insulating plate having an aperture therethrough, a thin metal disc-like ring adherent to said plate around said aperture, a thin insulating coating over said ring, a tuning element rotatable in said aperture and having a metal disc-like element overlying said ring and capacitively coupled thereto, a metal radial arm connected to said disc-like element, a metal slider on the outer end of said arm and movable therewith along one surface of said plate along a circular path, thirteen thin metal plate-like angularly spaced segmental electrodes adherent to said plate along said circular path, a thin insulating coating over said electrodes, said slider being movable into capacitive coupling relation with each of said electrodes in turn, said electrodes from the first to the last constituting an intermediate frequency resonating electrode for use with an ultrahigh frequency converter and channel electrodes for television channels two through thirteen, an inductance coil connecting said electrodes from the first to the last in series and comprising a plurality of ribbons adherent to said plate and extending between the successive electrodes, the sixth ribbon being a spiral coil element connected between the channel six and seven electrodes, and a tracking vane pivotally mounted on said plate adjacent said sixth ribbon for varying the inductance thereof.

5. A tuner for a plurality of high frequency channels, said tuner comprising a flat insulating plate having an aperture therethrough, a thin metal disc-like ring adherent to said plate around said aperture, a thin insulating coating over said ring, a tuning element rotatable in said aperture and having a metal disc-like element overlying said ring and capacitively coupled thereto, a metal radial arm connected to said disc-like element, a metal slider on the outer end of said arm and movable therewith along one surface of said plate in a circular path, a plurality of thin metal plate-like angularly spaced segmental electrodes adherent to said plate along said circular path and constituting channel electrodes corresponding sequentially to the high frequency channels to be covered, a thin insulating coating over said electrodes, said slider being movable into capacitive coupling relation with each of said electrodes in turn, an inductance coil connecting said electrodes sequentially in series and comprising a plurality of conductive ribbons adherent to said plate and extending between the successive electrodes, one of said ribbons being a spiral coil element connected between two of said electrodes, and a tracking vane pivotally mounted on said plate adjacent said spiral coil for varying the inductance thereof.

6. A tuner for a plurality of high frequency channels, said tuner comprising a flat insulating plate having an aperture therethrough, a thin metal disc-like ring adherent to said plate around said aperture, a thin insulating coating over said ring, a tuning element rotatable in said aperture and having a metal disc-like element overlying said ring and capacitively coupled thereto, a metal radial arm connected to said disc-like element, a metal slider on the outer end of said arm and movable therewith along one surface of said plate in a circular path, a plurality of thin metal plate-like angularly spaced segmental electrodes adherent to said plate along said circular path and constituting channel electrodes corresponding sequentially to the high frequency channels to be covered, a thin insulating coating over said electrodes, said slider being movable into capacitive coupling relation with each of said electrodes in turn, an inductance coil connecting said electrodes sequentially in series and comprising a plurality of conductive ribbons adherent to said plate and extending between the successive electrodes, said inductance coil including a spiral ribbon element adherent to said plate, and a tracking vane pivotally mounted on said plate adjacent spiral ribbon element for varying the inductance thereof.

References Cited in the file of this patent

UNITED STATES PATENTS

| | | |
|---|---|---|
| 1,671,143 | Campbell | May 29, 1928 |
| 2,244,023 | Saur | June 3, 1941 |
| 2,513,392 | Aust | July 4, 1950 |
| 2,627,579 | Wasmandorff | Feb. 3, 1953 |
| 2,665,377 | Krepps | Jan 5, 1954 |
| 2,678,435 | Vaugh | May 11, 1954 |
| 2,718,623 | Yoder | Sept. 20, 1955 |
| 2,760,127 | Duncan | Aug. 21, 1956 |